United States Patent
Isoda et al.

(10) Patent No.: US 12,048,252 B2
(45) Date of Patent: Jul. 23, 2024

(54) MAGNETORESISTIVE MEMORY DEVICE

(71) Applicants: KIOXIA CORPORATION, Tokyo (JP); SK HYNIX INC., Icheon-si (KR)

(72) Inventors: Taiga Isoda, Seoul (KR); Eiji Kitagawa, Seoul (KR); Young Min Eeh, Seongnam-si (KR); Tadaaki Oikawa, Seoul (KR); Kazuya Sawada, Seoul (KR); Kenichi Yoshino, Seongnam-si (KR); Jong Koo Lim, Icheon-si (KR); Ku Youl Jung, Seoul (KR); Guk Cheon Kim, Icheon-si (KR)

(73) Assignees: Kioxia Corporation, Tokyo (JP); SK HYNIX INC., Gyeonggi-Do (KR)

( * ) Notice: Subject to any disclaimer, the term of this patent is extended or adjusted under 35 U.S.C. 154(b) by 10 days.

(21) Appl. No.: 17/959,017

(22) Filed: Oct. 3, 2022

(65) Prior Publication Data

US 2023/0026414 A1 Jan. 26, 2023

Related U.S. Application Data

(62) Division of application No. 16/813,827, filed on Mar. 10, 2020, now Pat. No. 11,495,740.

(30) Foreign Application Priority Data

Sep. 11, 2019 (JP) ................. 2019-165449

(51) Int. Cl.
*H10N 50/85* (2023.01)
*G11C 11/16* (2006.01)
(Continued)

(52) U.S. Cl.
CPC .......... *H10N 50/85* (2023.02); *G11C 11/161* (2013.01); *G11C 11/1659* (2013.01);
(Continued)

(58) Field of Classification Search
CPC ........ H10N 50/85; G11C 11/161; H01F 41/32
See application file for complete search history.

(56) References Cited

U.S. PATENT DOCUMENTS 6,202,764 B1 3/2001 Ables et al.
9,184,374 B2 11/2015 Sawada et al.
(Continued)

FOREIGN PATENT DOCUMENTS

JP 2008041716 A 2/2008
JP 5429480 B2 2/2014
(Continued)

OTHER PUBLICATIONS

Transition metal, Wikipedia, archived Dec. 18, 2018 (Year: 2018).*
(Continued)

*Primary Examiner* — Shih Tsun A Chou
(74) *Attorney, Agent, or Firm* — Holtz, Holtz & Volek PC

(57) ABSTRACT

According to one embodiment, a magnetoresistive memory device includes: a first ferromagnetic layer; a stoichiometric first layer; a first insulator between the first ferromagnetic layer and the first layer; a second ferromagnetic layer between the first insulator and the first layer; and a non-stoichiometric second layer between the second ferromagnetic layer and the first layer. The second layer is in contact with the second ferromagnetic layer and the first layer.

2 Claims, 7 Drawing Sheets

(51) Int. Cl.
  *H01F 10/32* (2006.01)
  *H10B 61/00* (2023.01)
(52) U.S. Cl.
  CPC .......... *H01F 10/3286* (2013.01); *H10B 61/10* (2023.02); *H10B 61/22* (2023.02)

(56) References Cited

U.S. PATENT DOCUMENTS

| | | |
|---|---|---|
| 9,252,357 B2 | 2/2016 | Watanabe et al. |
| 9,293,695 B2 | 3/2016 | Ueda et al. |
| 9,305,576 B2 | 4/2016 | Noma |
| 9,337,415 B1 | 5/2016 | Oh et al. |
| 9,608,199 B1 | 3/2017 | Kitagawa |
| 9,620,561 B2 | 4/2017 | Nagase et al. |
| 9,741,928 B2 | 8/2017 | Ueda et al. |
| 9,947,862 B2 | 4/2018 | Watanabe et al. |
| 10,103,318 B2 | 10/2018 | Watanabe et al. |
| 10,263,178 B2 | 4/2019 | Sawada et al. |
| 10,388,343 B2 | 8/2019 | Oikawa et al. |
| 10,510,950 B2 | 12/2019 | Watanabe et al. |
| 2015/0008547 A1* | 1/2015 | Pi .......................... H10B 61/00 257/421 |
| 2015/0188048 A1 | 7/2015 | Wang et al. |
| 2017/0263680 A1 | 9/2017 | Yoshino et al. |
| 2018/0205006 A1 | 7/2018 | Watanabe et al. |
| 2018/0269043 A1 | 9/2018 | Ueda et al. |
| 2018/0277745 A1 | 9/2018 | Oikawa et al. |
| 2018/0321102 A1 | 11/2018 | Fuji et al. |
| 2018/0323371 A1 | 11/2018 | Liu et al. |
| 2019/0296226 A1 | 9/2019 | Eeh et al. |
| 2020/0091410 A1 | 3/2020 | Kitagawa et al. |

FOREIGN PATENT DOCUMENTS

| | | |
|---|---|---|
| JP | 2016015412 A | 1/2016 |
| JP | 2018082186 A | 5/2018 |
| JP | 2019165158 A | 9/2019 |

OTHER PUBLICATIONS

Oxford Reference, stoichiometric compound, Oxford University Press, 2013 (Year: 2013).

* cited by examiner

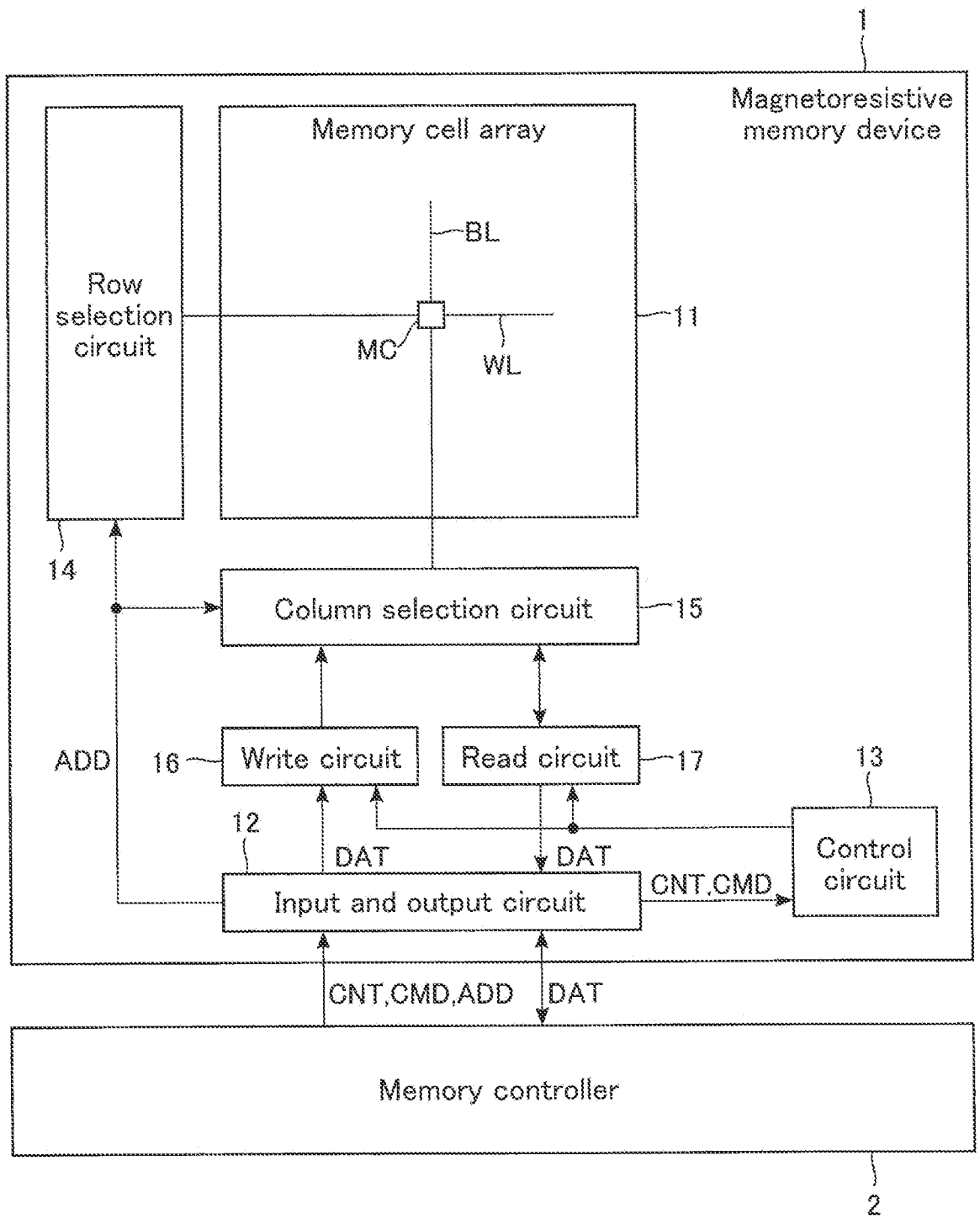
F I G. 1

MAGNETORESISTIVE MEMORY DEVICE

CROSS-REFERENCE TO RELATED APPLICATIONS

This application is a Divisional application of U.S. application Ser. No. 16/813,827, filed Mar. 10, 2020, which is based upon and claims the benefit of priority from prior Japanese Patent Application No. 2019-165449, filed Sep. 11, 2019, the entire contents of both of which are incorporated herein by reference.

FIELD

Embodiments generally relate to a magnetoresistive memory device.

BACKGROUND

A magnetoresistive memory device, which can store data using a magnetoresistive effect, is known.

BRIEF DESCRIPTION OF THE DRAWINGS

FIG. 1 shows functional blocks of a magnetoresistive memory device of a first embodiment.

DETAILED DESCRIPTION

Figure 2:
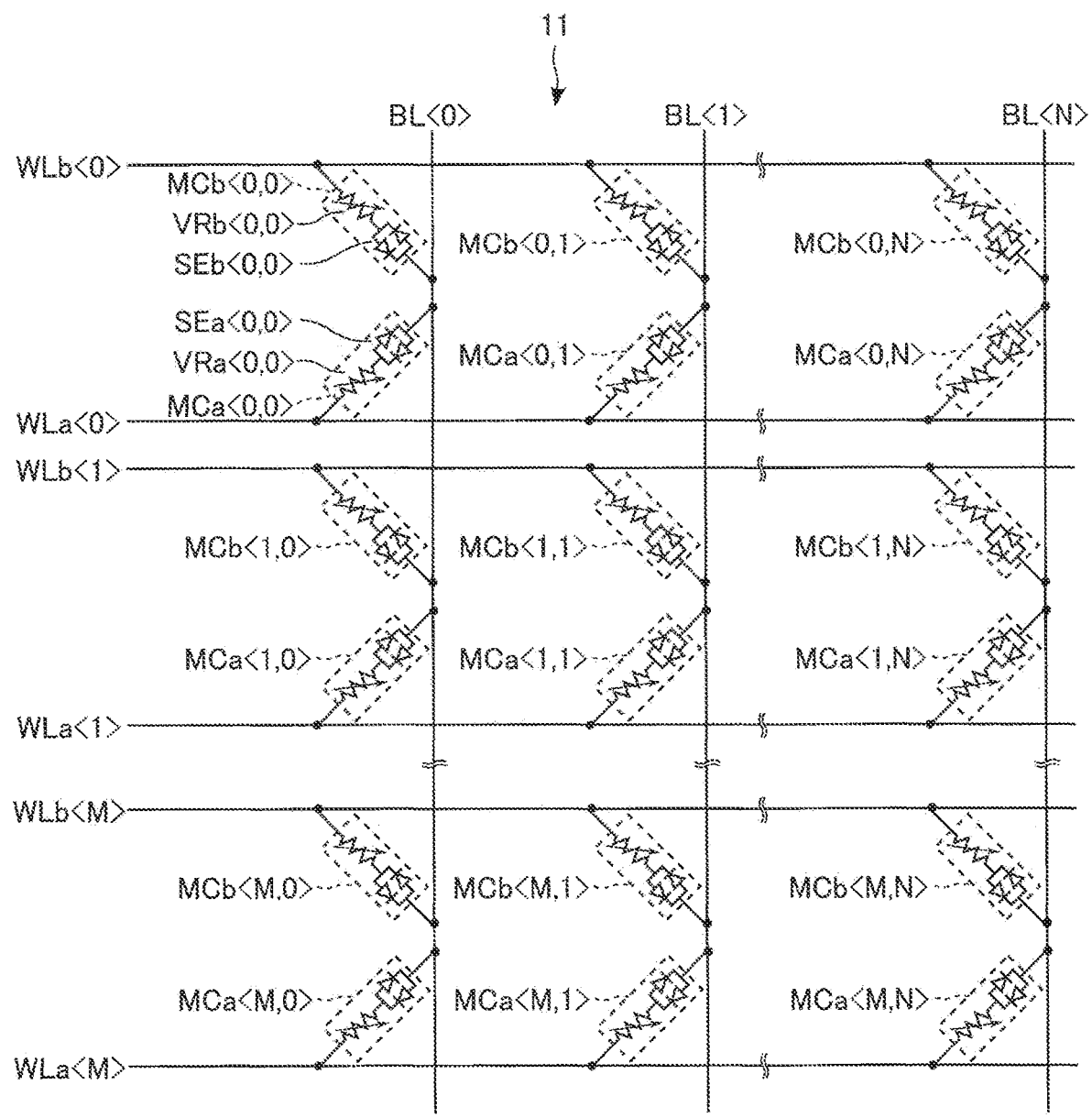
FIG. 2 is a circuit diagram of a memory cell array of the first embodiment.

In general, according to one embodiment, a magnetoresistive memory device includes: a first ferromagnetic layer; a stoichiometric first layer; a first insulating layer between the first ferromagnetic layer and the first layer; a second ferromagnetic layer between the first insulator and the first layer; and a non-stoichiometric second layer between the second ferromagnetic layer and the first layer. The second layer is in contact with the second ferromagnetic layer and the first layer.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures. Moreover, the entire description for a particular embodiment also applies to another embodiment unless it is explicitly mentioned otherwise or obviously eliminated.

First Embodiment

<1. Structure (Configuration)>
<1.1. Overall Structure>

FIG. 1 shows functional blocks of the magnetoresistive memory device according to the first embodiment. As shown in FIG. 1, a magnetoresistive memory device 1 includes a memory cell array 11, an input and output circuit 12, a control circuit 13, a row selection circuit 14, a column selection circuit 15, a write circuit 16, and a read circuit 17.

The memory cell array 11 includes memory cells MC, word lines WL, and bit lines BL. The memory cell MC can store data in a non-volatile manner. Each memory cell MC is coupled to one word line WL and one bit line BL. Each word line WL is associated with a row. Each bit line BL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selection circuit 14 receives the address signal ADD from the input and output circuit 12, and brings one word line WL associated with the row that is specified by the received address signal ADD into a selected state.

The column selection circuit 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selection circuit 15 based on the control by the control circuit 13 and the write data DAT.

The read circuit 17 includes a sense amplifier, and based on the control of the control circuit 13, uses the voltages used for data reading to determine data stored in the memory cells MC. The determined data is supplied to the input and output circuit 12 as the read data DAT.

<1.2. Circuit Configuration of Memory Cell Array>

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes: a first node coupled to one word line WL; and a second node coupled to one bit line BL. More specifically, the memory cells MCa encompass memory cells MCa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCa<$\alpha$, $\beta$> is coupled between the word line WLa<α> and the bit line BL<β>. Similarly, the memory cells MCb encompass memory cells MCb<α, β>, for all combinations of α and β, where α is every integer equal to or greater than 0 and equal to or less than M, and β is every integer equal to or greater than 0 and equal to or less than N, and the memory cell MCb<α, β> is coupled between the word line WLb<α> and the bit line BL<β>.

Each memory cell MC includes one magnetoresistive effect element VR (VRa or VRb) and one switching element SE (SEa or SEb). More specifically, the memory cell MCa<α, β> includes a magnetoresistive effect element VRa<α, β> and a switching element SEa<α, β> for all combinations of α and β, where α is every integer equal to or greater than 0 and equal to or less than M, and β is every integer equal to or greater than 0 and equal to or less than N. Moreover, each memory cell MCb<α, β> includes a magnetoresistive effect element VRb<α, β> and a switching element SEb<α, β> for all combinations of α and β, where α is every integer equal to or greater than 0 and equal to or less than M, and β is every integer equal to or greater than 0 and equal to or less than N.

In each memory cell MC, the magnetoresistive effect element VR and the switching element SE are coupled in series. The magnetoresistive effect element VR is coupled to one word line WL, and the switching element SE is coupled to one bit line BL.

The magnetoresistive effect element VR is capable of switching between a low-resistance state and a high-resistance state. The magnetoresistive effect element VR is capable of storing 1-bit data, utilizing the difference in the two resistance states.

The switching element SE includes two terminals. When a voltage smaller than a first threshold is applied in a first direction between the two terminals, the switching element SE is in a high-resistance state, i.e., electrically non-conductive (in an off state). On the other hand, when a voltage equal to or greater than a first threshold is applied in the first direction between the two terminals, the switching element SE is in a low-resistance state, for example, electrically conductive (in an on state). The switching element SE is further equipped with a function similar to the function of switching between the high-resistance state and the low-resistance state based on the magnitude of the voltage applied in the first direction, with respect to a second direction opposite to the first direction. By turning on or off the switching element SE, it is possible to perform control as to whether or not to supply a current to a magnetoresistive effect element VR coupled to the switching element SE, namely, whether or not to select the magnetoresistive effect element VR.

<1.3. Structure of Memory Cell Array>

Figure 3:
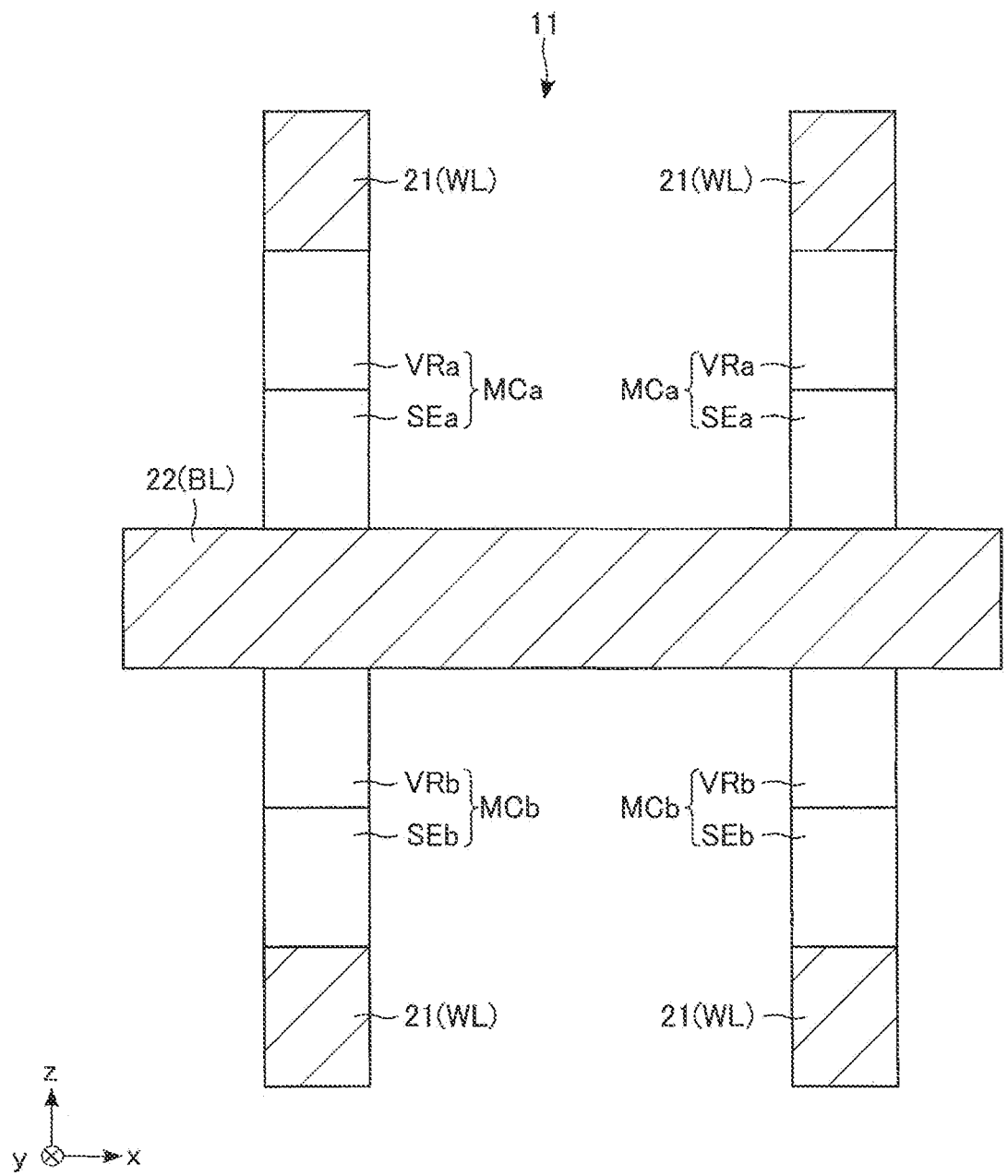
FIG. 3 shows a cross-section structure of part of the memory cell array of the first embodiment.

FIG. 3 shows a cross-section structure of part of the memory cell array 11 of the first embodiment.

As shown in FIG. 3, a plurality of conductors 21 are provided above a semiconductor substrate (not shown). The conductors 21 extend along the y-axis, and are aligned along the x-axis. Each conductor 21 functions as one word line WL.

Each conductor 21 is coupled, at its top surface, to the bottom surfaces of a plurality of memory cells MCb. The memory cells MCb are aligned along the y-axis on each conductor 21, and this arrangement provides a matrix of memory cells MCb. Each memory cell MC includes a structure that functions as a switching element SE and another structure that functions as a magnetoresistive effect element VR. The structure that functions as a switching element SE and the structure that functions as a magnetoresistive effect element VR each have one or more layers, as will be described later.

A plurality of conductors 22 are provided above the memory cells MCb. The conductors 22 extend along the x-axis, and are aligned along the y-axis. Each conductor 22 is coupled, at its bottom surface, to the top surfaces of a plurality of memory cells MCb aligned along the x-axis. Each conductor 22 functions as one bit line BL.

Each conductor 22 is coupled, at its top surface, to the bottom surfaces of a plurality of memory cells MCa. The memory cells MCa are aligned along the x-axis on each conductor 22, and this arrangement provides a matrix of memory cells MCa. A further conductor 21 is provided on the top surfaces of the memory cells MCa aligned along the y-axis. The memory cell array as shown in FIG. 2 can be realized by repeatedly providing the structure from the lower-most layer of conductor 21 to the layer of memory cells MCa shown in FIG. 2 along the z-axis.

The memory cell array 11 further includes an inter-layer insulator in a region where the conductors 21, conductors 22, and memory cells MC are not provided.

<1.4. Structure of Memory Cell>

Figure 4:
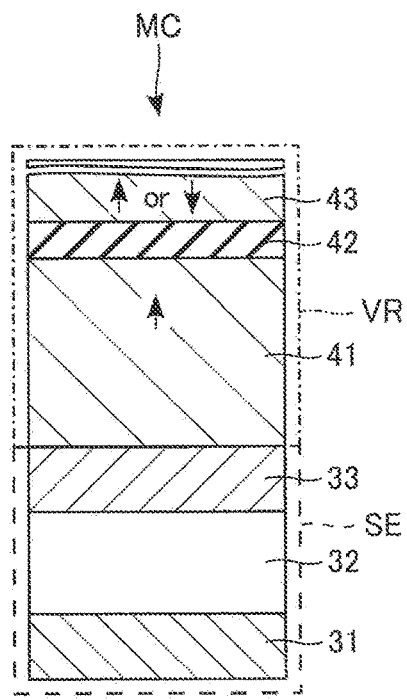
FIG. 4 shows an example of the structure of a memory cell of the first embodiment.

FIG. 4 shows an example of the structure of one memory cell MC of the first embodiment. As shown in FIG. 4, the memory cell MC includes a switching element SE and a magnetoresistive effect element VR on the switching element SE. The switching element SE includes a variable resistive material 32. The switching element SE may further include a bottom electrode 31 and a top electrode 33 as shown in FIG. 4.

The variable resistive material 32 is, for example, a switching element between two terminals, the first of the two terminals corresponding to one of the top surface and bottom surface of the variable resistive material 32, the second of the two terminals corresponding to the other one of the top surface and bottom surface of the variable resistive material 32. When a voltage applied between the two terminals is smaller than a threshold, the switching element is in a "high resistance" state, or, for example electrically non-conductive. When a voltage applied between the two terminals is greater than or equal to the threshold, the switching element becomes a "low resistance" state, or, for example, electrically conductive. The variable resistive material 32 includes at least one kind of chalcogen element selected from a group consisting of tellurium (Te), selenium (Se), and sulfur (S). Alternatively, the variable resistive material 32 may include chalcogenide, which is a compound including the above-described chalcogen element.

The magnetoresistive effect element VR exhibits a tunnel magnetoresistive effect, and includes a magnetic tunnel junction (MTJ). Specifically, the magnetoresistive effect element VR includes a ferromagnetic layer 41, an insulating layer 42, and a ferromagnetic layer 43. For example, as shown in FIG. 4, the insulating layer 42 is on the top surface of the ferromagnetic layer 41, and ferromagnetic layer 43 is on the top surface of the insulating layer 42.

Ferromagnetic layer 41 has an easy magnetization axis (indicated by an arrow) along a direction penetrating interfaces between ferromagnetic layer 41, insulating layer 42, and ferromagnetic layer 43, such as an easy magnetization axis at an angle from 45° to 90° with respect to the interfaces, or an easy magnetization axis along a direction orthogonal to the interfaces. The direction of magnetization of ferromagnetic layer 41 is intended to remain unchanged even when data is read or written in the magnetoresistive memory device 1. Ferromagnetic layer 41 can function as a so-called reference layer. Ferromagnetic layer 41 may include a plurality of layers.

Insulating layer 42 either contains or is made of, for example, magnesium oxide (MgO), and functions as a so-called "tunnel barrier".

Ferromagnetic layer 43 either contains or is made of, for example, cobalt iron boron (CoFeB) or iron boride (FeB). Ferromagnetic layer 43 has an easy magnetization axis (indicated by arrows) along a direction penetrating interfaces between ferromagnetic layer 41, insulating layer 42, and ferromagnetic layer 43, such as an easy magnetization axis at an angle from 45° to 90° with respect to the interfaces, or an easy magnetization axis along a direction orthogonal to the interfaces. The magnetization direction of ferromagnetic layer 43 can be changed by data writing, and the ferromagnetic layer 43 can function as a so-called "storage layer".

The property of the easy magnetization axis of ferromagnetic layer 41 or ferromagnetic layer 43 of extending along a direction penetrating the interfaces of ferromagnetic layer 41, insulating layer 42, and ferromagnetic layer 43, in particular, its property of forming an angle from 45° to 90° with respect to the interfaces, is referred to as a "perpendicular magnetic anisotropy".

When the magnetization direction of ferromagnetic layer 43 is parallel to the magnetization direction of ferromagnetic layer 41, the magnetoresistive effect element VR is in a state of having a lower resistance. When the magnetization direction of ferromagnetic layer 43 is anti-parallel to the magnetization direction of ferromagnetic layer 41, the magnetoresistive effect element VR is in a state of having a higher resistance.

When a certain magnitude of write current flows from the ferromagnetic layer 43 to the ferromagnetic layer 41, the magnetization direction of ferromagnetic layer 43 becomes parallel to the magnetization direction of the ferromagnetic layer 41. In contrast, when another magnitude of write current flows from ferromagnetic layer 41 to ferromagnetic layer 43, the magnetization direction of ferromagnetic layer 43 becomes anti-parallel to the magnetization direction of the ferromagnetic layer 41.

The memory cell MC includes further layers. The further layers will be described with reference to FIG. 5.

Figure 5:
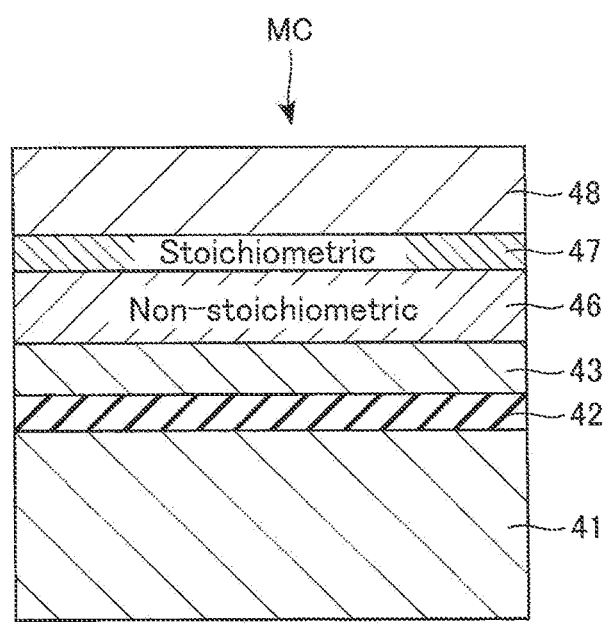
FIG. 5 shows details of an example of the structure of a part of the memory cell of the first embodiment.

FIG. 5 shows details of an example of the structure of a part of the memory cell MC according to the first embodiment. As shown in FIG. 5, the memory cell MC further includes a cap layer 46, a diffusion prevention layer (or, cap layer) 47, and a top layer 48.

The cap layer 46 is on the top surface of the ferromagnetic layer 43. The cap layer 46 is intended to absorb boron contained in the ferromagnetic layer 43. When being formed, the ferromagnetic layer 43 contains boron for, for example, realizing the properties required for the ferromagnetic layer 43. However, after the ferromagnetic layer 43 is formed, boron is not necessarily required. If anything, the less boron the ferromagnetic layer 43 contains, the higher the magnetic property, e.g., the perpendicular magnetic anisotropy, the ferromagnetic layer 43 has. For this reason, for example, the cap layer 46 is provided, and is helpful in absorbing boron diffused outside the ferromagnetic layer 43 in the process after the ferromagnetic layer 43 is formed.

The cap layer 46 is, for example, in a non-stoichiometric state (non-stoichiometric). The cap layer 46 includes one or more of respective nitrides and respective oxides of FeCoB-alloy, Fe, Co, B, magnesium (Mg), aluminum (Al), silicon (Si), calcium (Ca), scandium (Sc), titanium (Ti), vanadium (V), chrome (Cr), yttrium (Y), and gadolinium (Gd).

The diffusion prevention layer 47 is on the top surface of the cap layer 46. The diffusion prevention layer 47 is intended to prevent iron atoms in ferromagnetic layer 43 from widely diffusing outside the ferromagnetic layer 43. To serve this purpose, the diffusion prevention layer 47 is made of a stable material having a small lattice constant. To have such a feature, the diffusion prevention layer 47 can be stoichiometric. In the present specification and claims, a material being stoichiometric does not mean the material having a composition ratio 100% matching that of the chemical formula of the material. In actuality, a 100%-ideal stoichiometric state cannot be attained and, in general, when a stoichiometric material is formed on a sputtering target by sputtering (RF sputtering) using energy in a radio frequency (RF) region, the film formed by such sputtering is considered to be stoichiometric. By applying this general notion, the "stoichiometric" in the present specification and claims is defined as having the same stoichiometric property (degree of stoichiometry) as the film formed by such RF sputtering, or higher.

Being stoichiometric can also be defined as follows: As described above, iron atoms in the ferromagnetic layer 43 may diffuse outside the ferromagnetic layer 43. When having a higher stoichiometric property, the diffusion prevention layer 47 can more strongly prevent the diffusion of iron atoms from the ferromagnetic layer 43. The more iron atoms diffuse outside the ferromagnetic layer 43 after being formed, the thinner the ferromagnetic layer 43 after diffusion becomes in comparison with the ferromagnetic layer 43 before diffusion (immediately after being formed). Based on the relationships of these phenomena, it can be considered that the smaller the difference in thickness of the ferromagnetic layer 43 before and after diffusion of iron atoms is, the higher the stoichiometric property the diffusion prevention layer 47 has. Based on this, being stoichiometric can be defined based on the difference in thickness of the ferromagnetic layer 43 before and after diffusion of iron atoms.

The thickness before diffusion can be a target thickness (or, set thickness) of ferromagnetic layers 43 input to a device that forms the ferromagnetic layers 43. In contrast, the thickness after diffusion can be the actual thickness of a ferromagnetic layer 43 of the finished magnetoresistive memory device 1, or the actual thickness after a film (for example, the cap layer 46) above the ferromagnetic layer 43 is formed.

Based on the above-described factors, a first material being stoichiometric can also be defined as follows: The first material is stoichiometric when the first material has a certain degree of stoichiometric property, diffusion of a kind of atoms in a second material is prevented by the first material, and the second material after diffusion of the atoms has a thickness equal to or greater than 89% the thickness of the second material before diffusion. Specifically, the diffusion prevention layer 47 is stoichiometric when the ferromagnetic layer 43 after diffusion has a thickness equal to or greater than 89% the set thickness of the ferromagnetic layer 43.

Based on the diffusion prevention layer 47 being intended to prevent iron atoms from passing therethrough, the diffusion prevention layer 47 can include a compound of a material made of an atom smaller than the iron atom. Specifically, the diffusion prevention layer 47 is made of one or more of $B_2O_3$, MgO, $Al_2O_3$, $SiO_2$, CaO, $Sc_2O_3$, $TiO_2$, $V_2O_5$, $Cr_2O_3$, FeO, $Fe_3O_4$, $Fe_2O_3$, CoO, $Co_3O_4$, BN, $B_4C$, diamond, and graphite.

The diffusion prevention layer 47 can also be formed by RF sputtering.

The top layer 48 is on the top surface of the diffusion prevention layer 47. The top layer 48 includes one or more of platinum (Pt), tungsten (W), tantalum (Ta), and ruthenium (Ru).

A further layer may be formed on the top surface of the top layer 48.

<1.5. Advantages (Advantageous Effects)>

According to the first embodiment, a high-performance memory cell MC can be realized as will be described below.

The realization of a high-performance memory cell MC relates to the following two factors: The first factor is to reduce the number of boron atoms which are included in ferromagnetic layer 43 while the layer of a ferromagnetic layer 43 is being formed, after the layer is formed. The second factor is to prevent iron atoms in the ferromagnetic layer 43 from widely diffusing outside the ferromagnetic layer 43.

To realize a high-performance memory cell MC, a cap layer may be provided on the ferromagnetic layer 43. The cap layer is required to have the following two functions: The first function is to absorb boron atoms diffused from the ferromagnetic layer 43 so as to reduce the number of boron atoms in the ferromagnetic layer 43.

The second function is to prevent iron atoms diffused from ferromagnetic layer 43 from passing through the cap layer. Even when iron atoms leave ferromagnetic layer 43, if they are held up in the cap layer, high performance of the memory cell MC can be maintained through cooperation between ferromagnetic layer 43 and the cap layer.

To realize the first function required for the cap layer, a non-stoichiometric cap layer may be used. Such a cap layer absorbs boron atoms diffused from the ferromagnetic layer 43; accordingly, the number of boron atoms in ferromagnetic layer 43 decreases. However, the non-stoichiometric cap layer allows iron atoms diffused from ferromagnetic layer 43 to pass therethrough. Therefore, iron atoms cannot be held up in the ferromagnetic layer 43, and the number of iron atoms in the ferromagnetic layer 43 unintentionally decreases.

To realize the second function required for the cap layer, a stoichiometric cap layer may be used. Such a cap layer can prevent iron atoms diffused from the ferromagnetic layer 43 from passing therethrough.

However, the stoichiometric cap layer does not absorb boron atoms as much as required, and is not greatly helpful in realizing a ferromagnetic layer 43 having a high magnetic property.

Figure 6:
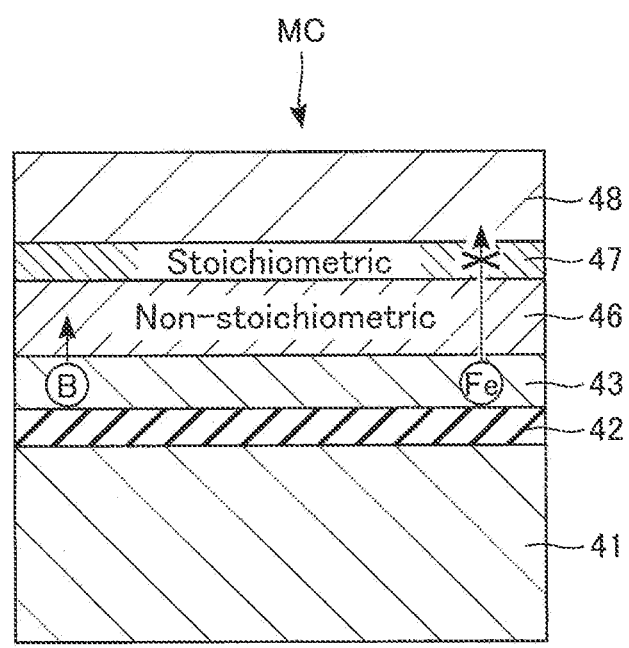
FIG. 6 shows diffusion of atoms in the memory cell of the first embodiment.

According to the first embodiment, a non-stoichiometric cap layer 46 is provided on the top surface of a ferromagnetic layer 43, and a stoichiometric diffusion prevention layer 47 is provided on the top surface of the cap layer 46. Being non-stoichiometric, the cap layer 46 can absorb boron atoms (B) diffused from ferromagnetic layer 43, as shown in FIG. 6. In contrast, iron atoms (Fe) diffused from the ferromagnetic layer 43 pass through the cap layer 46. However, since the diffusion prevention layer 47 is stoichiometric, the iron atoms are blocked by the diffusion prevention layer 47, and are prevented from reaching the top layer 48. Accordingly, absorption of boron atoms from the ferromagnetic layer 43 and prevention of iron atoms from the ferromagnetic layer 43 from reaching the top layer 48 are mutually compatible.

<1.6. Modification>

Figure 7:
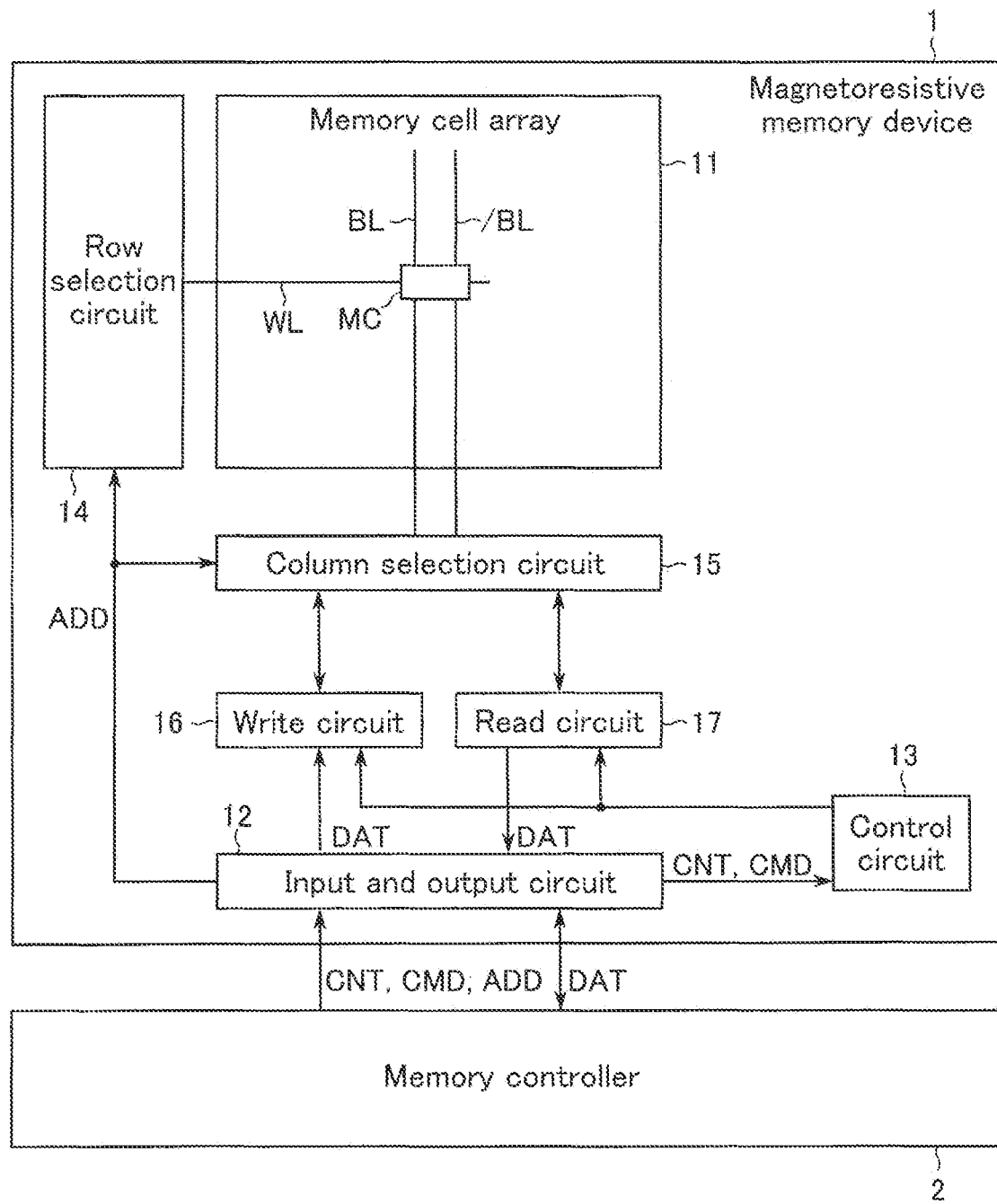
FIG. 7 shows functional blocks of a magnetoresistive memory device of a modification of the first embodiment.

The memory cell MC can include a select transistor ST instead of a switch element SE. FIG. 7 shows functional blocks of a magnetoresistive memory device of a modification of the first embodiment. As shown in FIG. 7, the memory cell array 11 includes a plurality of bit lines BL and /BL. One bit line BL and one bit line /BL form a bit line pair. Each memory cell MC is coupled to one word line WL and one bit line pair BL and /BL. The bit line pair BL and /BL is associated with a column, and is coupled to the column selection circuit 15. Selection of one row and selection of one or more columns specify one or more memory cells MC.

Figure 8:
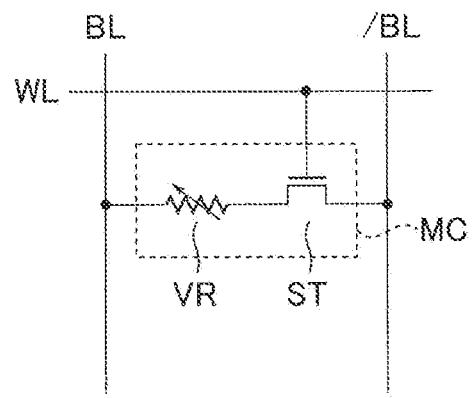
FIG. 8 is a circuit diagram of a memory cell of the modification of the first embodiment.

FIG. 8 is a circuit diagram of a memory cell of the modification of the first embodiment. The memory cell MC includes a magnetoresistive effect element VR and a select transistor ST. The select transistor ST is, for example, an n-type metal oxide semiconductor field effect transistor (MOSFET). The magnetoresistive effect element VR is coupled to one bit line BL at its first end, and is coupled to the first end (source or drain) of the select transistor ST at its second end. The second end (drain or source) of the select transistor ST is coupled to the bit line /BL. The gate of the select transistor ST is coupled to one word line WL, and the source thereof is coupled to bit line /BL.

Second Embodiment

The second embodiment differs from the first embodiment in terms of the positions of the cap layer 46 and the diffusion prevention layer 47. Hereinafter, points different from the first embodiment will be mainly described.

Figure 9:
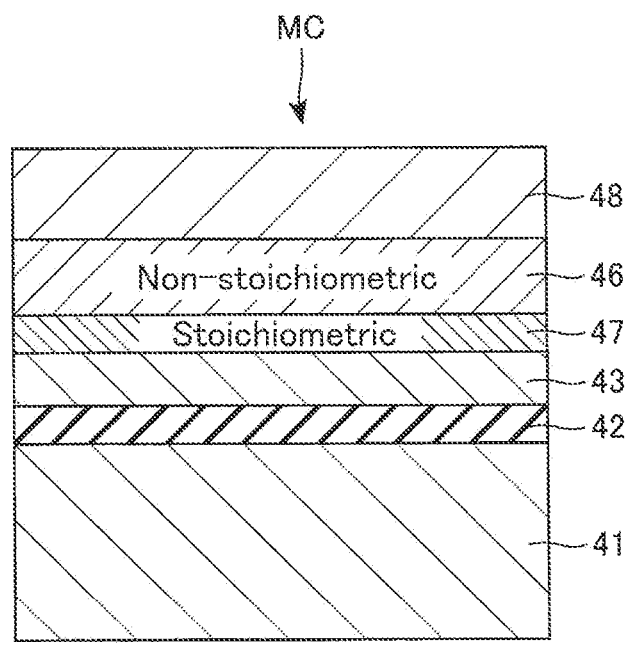
FIG. 9 shows details of an example of the structure of a part of a memory cell of a second embodiment.

FIG. 9 shows details of an example of the structure of a part of a memory cell MC of the second embodiment. As shown in FIG. 9, the diffusion prevention layer 47 is on the top surface of ferromagnetic layer 43, and the cap layer 46 is on the top surface of the diffusion prevention layer 47. The top layer 48 is on the top surface of the cap layer 46.

The memory cell MC of the second embodiment includes a stoichiometric diffusion prevention layer 47 and a non-stoichiometric cap layer 46 between ferromagnetic layer 43 and the top layer 48, as in the first embodiment. Therefore, the memory cell MC of the second embodiment offers the same advantages as those of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a first ferromagnetic layer;
a non-stoichiometric first layer including one or more of respective nitrides and respective oxides of FeCoB-alloy, Fe, B, Mg, Al, Si, Ca, and Gd;
a first insulator between the first ferromagnetic layer and the non-stoichiometric first layer;
a second ferromagnetic layer between the first insulator and the non-stoichiometric first layer; and
a stoichiometric second layer between the second ferromagnetic layer and the non-stoichiometric first layer, the stoichiometric second layer being in contact with the second ferromagnetic layer and the non-stoichiometric first layer, the stoichiometric second layer including one or more of $B_2O_3$, $Al_2O_3SiO_2$, CaO, $Sc_2O_3$, $TiO_2$, $V_2O_5$, $Cr_2O_3$, FeO, $Fe_3O_4$, $Fe_2O_3$, CoO, $Co_3O_4$, BN, $B_4C$, diamond, and graphite.

2. The device according to claim 1, wherein the stoichiometric second layer is made of one of $B_2O_3$, $Al_2O_3$, $SiO_2$, CaO, $Sc_2O_3$, $TiO_2$, $V_2O_5$, $Cr_2O_3$, FeO, $Fe_3O_4$, $Fe_2O_3$, CoO, $Co_3O_4$, BN, $B_4C$, diamond, and graphite.

* * * * *